(12) United States Patent
Aoki

(10) Patent No.: US 6,717,188 B2
(45) Date of Patent: Apr. 6, 2004

(54) SEMICONDUCTOR DEVICE

(75) Inventor: Shigetaka Aoki, Kashihara (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/067,866

(22) Filed: Feb. 8, 2002

(65) Prior Publication Data

US 2002/0185656 A1 Dec. 12, 2002

(30) Foreign Application Priority Data

Jun. 7, 2001 (JP) ........................ 2001-172477

(51) Int. Cl.[7] ...................... H01L 31/072; H01L 35/26; H01L 31/0328; H01L 31/0336; H01L 27/102
(52) U.S. Cl. ................ 257/191; 257/197; 257/200; 257/592
(58) Field of Search ................ 257/191, 197, 257/200, 592

(56) References Cited

U.S. PATENT DOCUMENTS

| | | | | |
|---|---|---|---|---|
| 5,323,032 A | * | 6/1994 | Sato et al. | 257/198 |
| 5,352,912 A | * | 10/1994 | Crabbe et al. | 257/198 |
| 5,440,152 A | * | 8/1995 | Yamazaki | 257/197 |
| 6,316,795 B1 | * | 11/2001 | Croke, III | 257/197 |
| 6,388,307 B1 | * | 5/2002 | Kondo et al. | 257/592 |

FOREIGN PATENT DOCUMENTS

| | | |
|---|---|---|
| JP | 04-247664 | 9/1992 |
| JP | 05-183154 | 7/1993 |
| JP | 10-93076 | 4/1998 |
| JP | 11-233771 | 8/1999 |

OTHER PUBLICATIONS

S.K. Ray et al. "Novel SiGeC Channel Heterojunction PMOSFET", Technical Digest of International Electron Devices Meeting 1996, pp. 261–264.

M. Gluck et al., "Modulation–doped $Si_{1-x-y}Ge_xC_y$ p–type Hetero–FETs", Physica E, Jul. 1998, vol. 2, pp. 768–771.

Eduardo Jose Quinones et al. "Design, Fabrication, and Analysis of SiGeC Heterojunction PMOSFETs", IEEE Transactions on Electron Devices, Sep. 2000, vol. 37, No. 9, pp. 1715–1725.

* cited by examiner

*Primary Examiner*—Eddie Lee
*Assistant Examiner*—Samuel A Gebremariam
(74) *Attorney, Agent, or Firm*—McDermott, Will & Emery

(57) ABSTRACT

A SiGe-HBT is provided with a SiGe film and a Si film grown in succession by epitaxial growth. The SiGe film is made up of a SiGe buffer layer, a SiGe graded composition layer, and a SiGe upper layer, in which the Ge content is substantially constant or changes not more than that of the SiGe graded composition layer. Even if there are fluctuations in the position of the EB junction, the EB junction is positioned in a portion of the SiGe upper layer, so fluctuations in the Ge content in the EB junction can be inhibited, and a stable high current amplification factor can be obtained. It is also possible to provide a SiGeC film instead of the SiGe film.

9 Claims, 7 Drawing Sheets

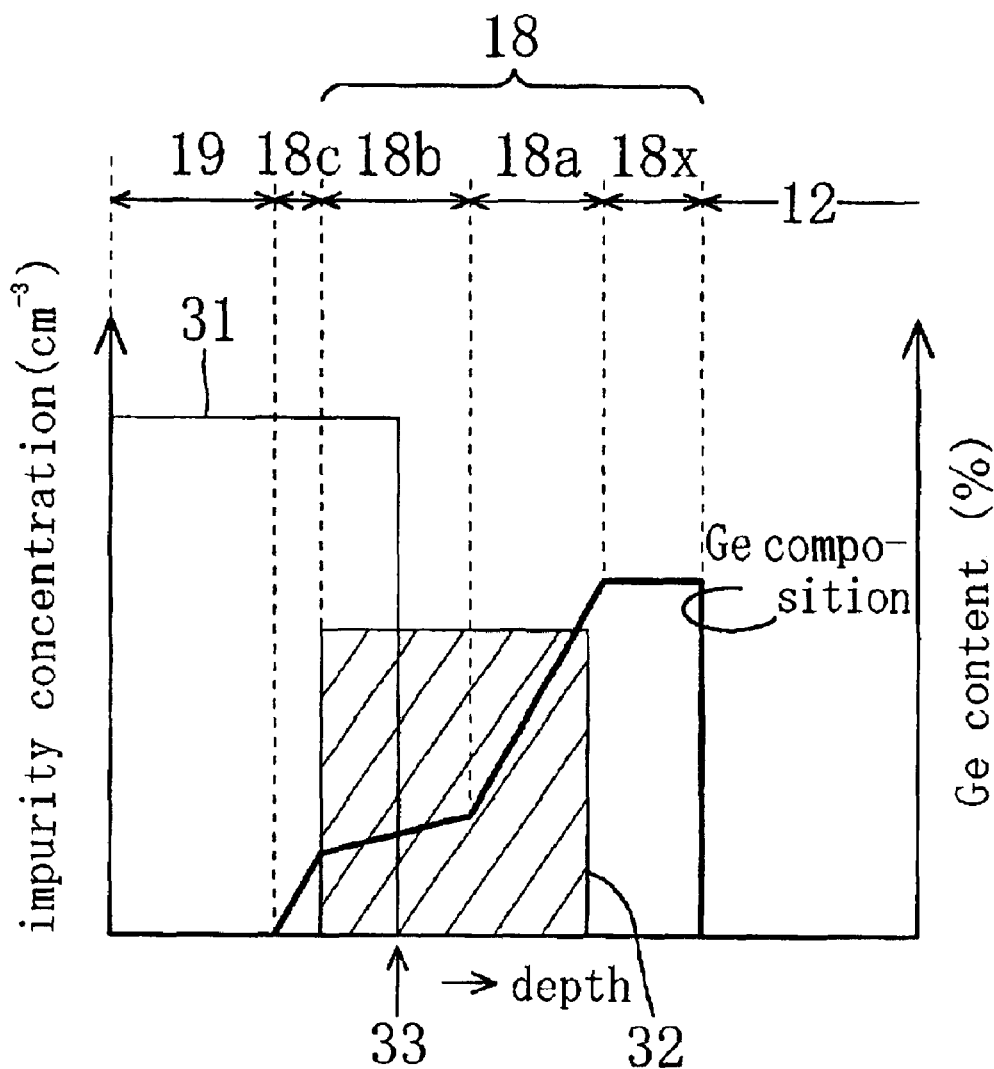

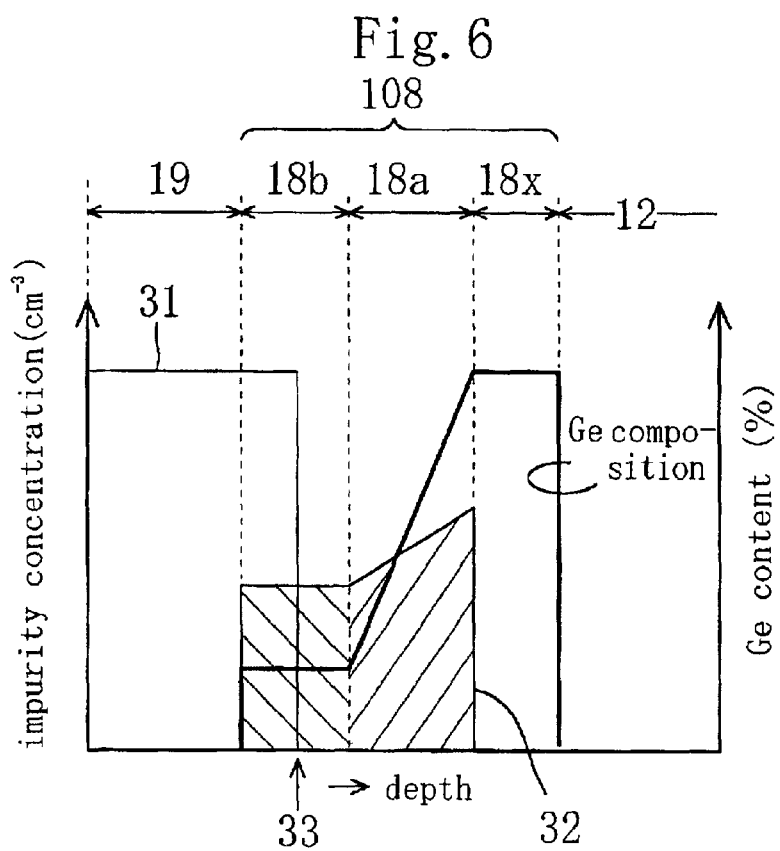
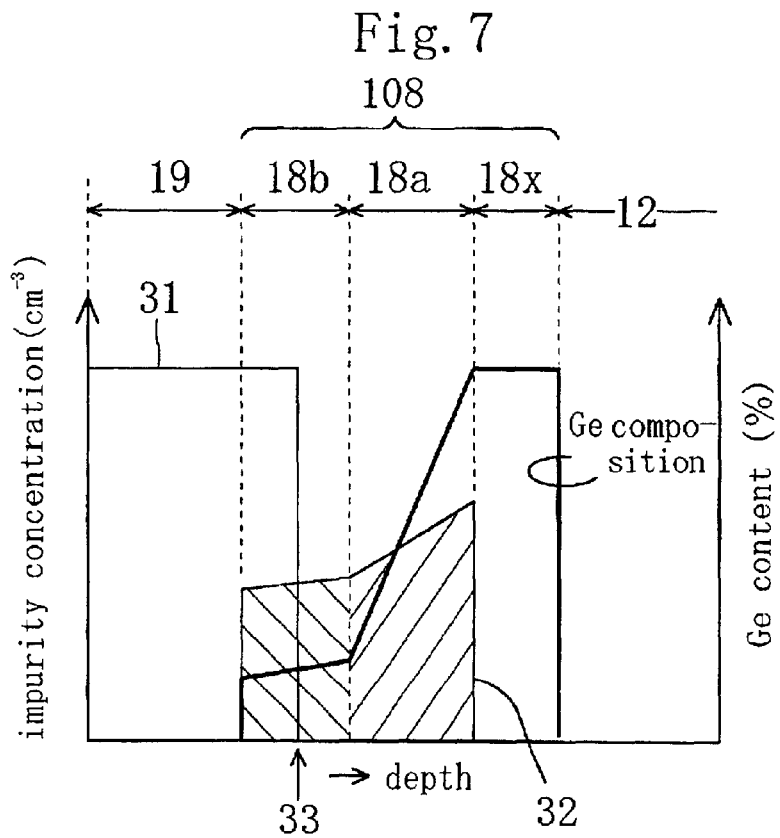

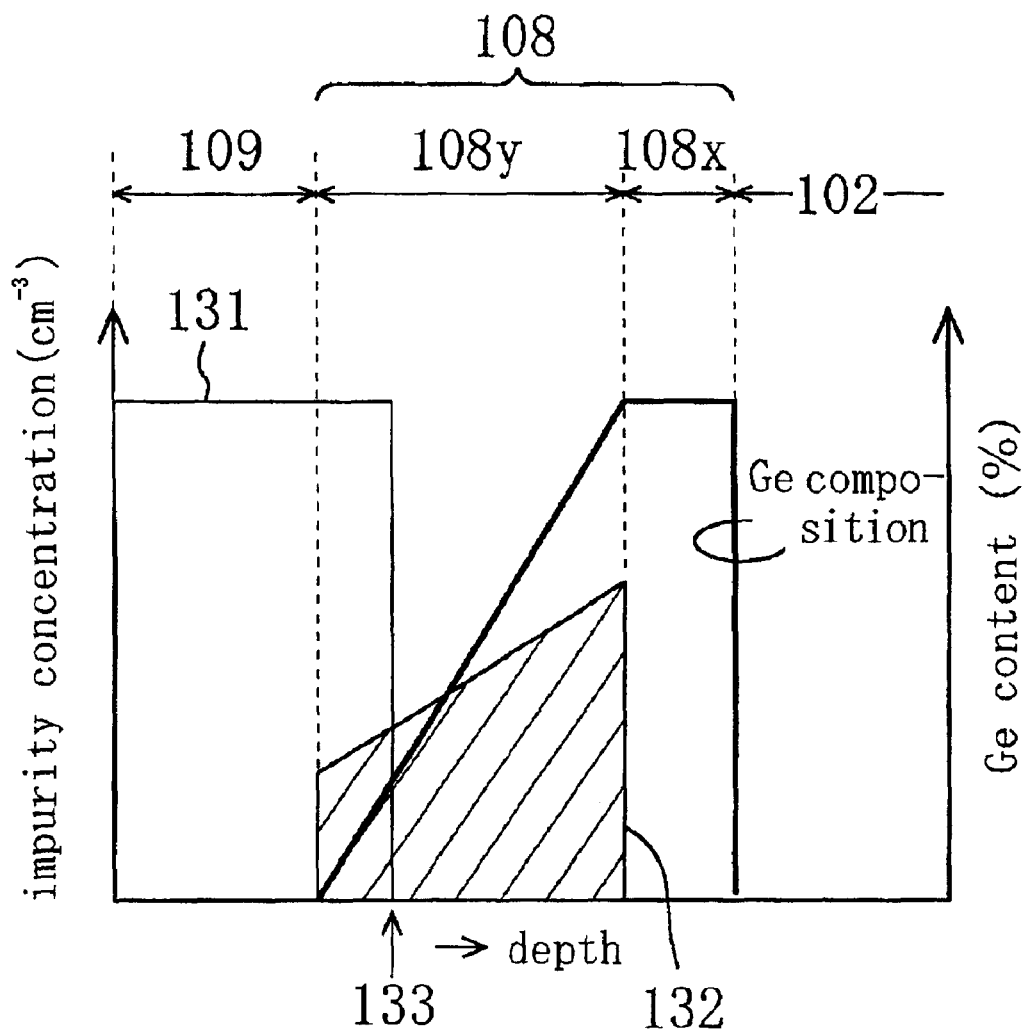

SEMICONDUCTOR DEVICE

BACKGROUND OF THE INVENTION

The present invention relates to a semiconductor device that functions as a heterojunction bipolar transistor, and in particular to measures for suppressing variations in properties such as the current amplification factor.

In recent years, progress in miniaturization and self-aligning technology has led to smaller and faster bipolar transistors formed using a silicon substrate. Ordinary bipolar transistors are so-called homojunction bipolar transistors, which use a silicon substrate and a monocrystalline silicon layer epitaxially grown on the silicon substrate.

On the other hand, heterojunction bipolar transistors (hereinafter, referred to as "HBT") are being actively researched and developed for the purpose of further increasing operating speeds. In particular recently, there has been a strong push for the development of HBTs in which a SiGe layer, which is a mixed crystal of silicon and germanium, is epitaxially grown on a silicon substrate, and the SiGe layer is taken as a base layer (hereinafter referred to as "SiGe-HBT").

FIG. 8 is a cross-sectional view of a conventional SiGe-HBT. As shown in the drawing, conventional SiGe-HBTs are formed using a Si substrate 101 and a Si epitaxial layer 102 epitaxially grown on the Si substrate 101. They also include an N$^+$ buried layer 110, which is provided spanning a portion of the Si substrate 101 and a portion of the Si epitaxial layer 102, and an N$^+$ collector lead layer 111, which is provided by introducing a relatively high concentration of N-type impurities into a portion of the Si epitaxial layer 102. The portion of the Si epitaxial layer 102 other than the N$^+$ collector lead layer 111 is an N$^-$ collector diffusion layer 112, which includes a low concentration of N-type impurities. Furthermore, LOCOS isolations 116 separating the Si epitaxial layer 102 into the bipolar transistor formation regions, and deep trench isolations 117, which extend downward from the LOCOS isolations 116 and into the Si substrate 101, are also provided. However, in the bipolar transistor formation region there is no deep trench isolation 117 provided below the LOCOS isolation 116 separating the N$^+$ collector lead layer 111 and the N$^-$ collector diffusion layer 112.

Furthermore, a SiGe film 108, which is made of a SiGe mixed crystal semiconductor layer and includes P-type impurities, and a Si film 109, serving as the cap layer, are formed by epitaxial growth on the N$^-$ collector diffusion layer 112 of the Si epitaxial layer 102. The SiGe-HBT also includes a P$^+$ base polysilicon film 114, which is formed on the region spanning from the lateral surfaces of the SiGe film 108 and the Si film 109 to the upper surface of the Si film 109 and includes a high concentration of P-type impurities, and an N$^+$ emitter polysilicon film 113 including a high concentration of N-type impurities, which is provided over an opening formed in the P$^+$ base polysilicon film 114 including a high concentration of P-type impurities. However, the P$^+$ base polysilicon film 114 and the N$^+$ emitter polysilicon film 113 are electrically separated from each other by an insulating film.

Here, the SiGe film 108 and the Si film 109 are epitaxially grown using MBE, UHV-CVD, or LP-CVD. The region of the Si film 109 directly below the N$^+$ emitter polysilicon film 113 is doped with N-type impurities (phosphorus or arsenic, for example) that have been diffused from the N$^+$ emitter polysilicon film 113 by RTA. That is, the N$^+$ region of the Si film 109 functions as the emitter region of the NPN bipolar transistor, the P$^+$ region of the SiGe film 108 functions as the base region of the NPN bipolar transistor, and the N$^-$ collector diffusion layer 112, the N$^+$ buried layer 110, and the N$^+$ collector lead layer 111 function as the collector region of the NPN bipolar transistor.

In the process for manufacturing the semiconductor device, after the SiGe film 108 is epitaxially grown on the Si epitaxial layer 102, the Si film 109 is then successively grown epitaxially on the SiGe film 108. The Si film 109 is necessary for preventing Ge contamination of the manufacturing line primarily during the further process steps after the epitaxial growth of SiGe, however, it is possible to form an emitter-base junction (hereinafter, called the "EB junction") at a desired depth and position in the Si film 109 by adequately selecting the thermal processing conditions for diffusing the N-type impurities in accordance with the film thickness of the Si film 109 and the concentration of the N-type impurities in the emitter polysilicon film 113.

Conventional SiGe-HBTs formed in this way have the advantage over homojunction bipolar transistors made from only a Si layer that impurities do not have to be doped to a high concentration in the emitter region to achieve a large emitter injection efficiency, and they can be expected to have a high current amplification factor ($h_{FE}$).

FIG. 9 is an energy band diagram for comparing the band structures of Si/SiGe heterojunction bipolar transistor (SiGe-HBT) with graded composition and a Si homojunction bipolar transistor (Si-BT). In the SiGe-HBT, the height of the barrier with respect to holes injected into the emitter region from the base region can be made larger than the height of the barrier with respect to electrons injected from the emitter region into the base region. For this reason, the emitter injection efficiency does not drop even if the impurity concentration of the emitter region is lowered and the impurity concentration of the base region is raised.

Put differently, with SiGe-HBTs the narrow band gap properties of SiGe can be used to achieve a higher current amplification factor than in Si-BTs, even if the emitter region is not doped to a high concentration.

Si has a band gap of approximately 1.1 eV, and Ge has a band gap of approximately 0.7 eV. When a SiGe film includes 10 to 15% Ge, the band gap is between that of Si and Ge, at about 1.0 eV. Thus, monotonically increasing the Ge content in the SiGe film 108 from the emitter side to the collector side (graded composition) creates a graded structure in which the energy band gap Eg becomes continually smaller from the emitter side toward to the collector side, as shown by the solid line in FIG. 9. For this reason, an internal electric field E, as expressed by the following equation (1):

$$E(eV)=(1.1-1.0)/qW \tag{1}$$

(q: charge amount, W: base width) occurs in the base layer, and the minority carriers that are injected from the emitter into the base can be accelerated by the electric field E. Therefore, higher operation speeds than conventional Si-BTs, in which the minority carriers transit through the base region only by diffusion, can be easily achieved.

However, the above-described conventional SiGe-HBTs have the following problems.

FIG. 10 is a diagram showing the impurity concentration distribution and the change in the Ge content in the depth direction in the cross section taken along the line X—X shown in FIG. 8. As shown in FIG. 10, the SiGe film 108 is divided into an undoped SiGe buffer layer 108x, and a SiGe graded composition layer 108y into which P-type impurities have been introduced at a high concentration, and which has a continuously changing band gap. A P-type impurity diffusion region 132, serving as the base region, is formed in the upper part the SiGe film 108, and an N-type impurity diffusion region 131, which serves as the emitter region, is formed spanning from the Si film 109 into a portion of the SiGe film 108. That is, the P-type impurity diffusion region 132 and the N-type impurity diffusion region 131 overlap. The reason for this is that during thermal processing for forming the emitter region, N-type impurities from the emitter polysilicon film 113 reach into not only the Si film 109 but also a portion of the SiGe film 108 below the Si film 109.

FIG. 11 is a diagram for illustrating the variations in the diffusion depth of N-type impurities in the SiGe graded composition layer 108y. As illustrated in the drawing, thermal processing conditions can result in large variations in the diffusion depth of the N-type impurities, which determines an EB junction 133. Thus, it is extremely difficult to control the positioning of the EB junction 133 with precision and eliminate variations in that positioning.

As mentioned above, in conventional SiGe-HBTs, the diffusion depth of the emitter region fluctuates, so the Ge content in the EB junction 133 fluctuates in practice. As a result, when for example the Ge content in the EB junction 133 increases, the band gap in the EB junction 133 becomes smaller and thus the collector current is increased, as a result leading to the effect that the current amplification factor is increased. That is, minute fluctuations in the Ge content in the EB junction 133 cause large fluctuations in the current amplification factor, thus making it difficult to obtain a transistor in which the current amplification factor is constant and has few variations.

When the base layer is made thin to increase the speed of the transistor, the grading of the change of the Ge content becomes particularly large, and thus small fluctuations in the position of the EB junction 133 have a noticeable influence on variations in the current amplification factor.

On the other hand, if the EB junction 133 is formed not in the SiGe film 108 but in the Si film 109, then the EB junction 133 is separated from the heterojunction and the effect of the narrow band gap is lost. Thus, a high current amplification factor and the effects of the heterojunction itself can no longer be obtained.

Furthermore, in conventional SiGe-HBTs, there was the problem that it was difficult to control the concentration of boron (B) in the base region.

For example, it is known that when $B_2H_6$ is used as the boron source gas, the concentration of boron in the film is reduced (ratio of incorporated B is reduced) together with a reduction in the Ge content, even if the flow rate of $B_2H_6$ is constant while depositing the SiGe film. That is, when SiGe-HBTs have a graded SiGe composition, the boron concentration is graded with the same orientation as the grading of the Ge.

FIG. 12 is a diagram showing the impurity concentration distribution and change in the Ge content in the depth direction in a conventional SiGe-HBT when the flow rate of $B_2H_6$ is constant. As shown in FIG. 12, it can be understood that along with the reduction in the Ge content in the SiGe graded composition layer 108y, the boron concentration of the P-type impurity diffusion region 132 is also reduced. Then, when variations occur in the position of the EB junction 133, the variations in the concentration of B in the EB junction 133 increase, resulting in increased variations in EB breakdown voltage properties.

In SiGe-HBTs, however, the goal is to lower the base resistance by making the boron concentration in the base region greater than that of ordinary Si-BJTs (or in some cases, greater than the N-type impurity concentration of the emitter region). On the other hand, the EB breakdown voltage drops when the boron concentration of the base region is raised too high, so the boron concentration must be adjusted to keep the base resistance and the EB breakdown voltage within a desired range. In SiGe-HBTs, however, if variations in the EB breakdown voltage increase, then the design margin is narrowed, and there is the risk that it will become difficult to adjust the boron concentration such that the base resistance and the EB breakdown voltage are kept within the desired ranges.

On the other hand, the Ge content in the SiGe film is regulated by the flow rate of the Ge source gas ($GeH_4$, for example), so to compensate for the drop in the amount of incorporated boron that occurs along with the drop in the Ge content (drop in the $GeH_4$ flow rate) the flow rate of $B_2H_6$ can in principle be increased to keep a constant boron concentration in the SiGe film. In actuality, however, the $GeH_4$ flow rate and the Ge content in the SiGe film are not proportional, nor are the flow rate of the $B_2H_6$ and the boron concentration in the SiGe film proportional, so regulating the gas flow rate in this way would lead to a more complicated manufacturing process.

SUMMARY OF THE INVENTION

A primary object of the present invention is to devise a means for inhibiting variations in the band gap of the EB junction, even if there are fluctuations in the position of the EB junction during manufacturing, in a heterojunction bipolar transistor having a structure with a graded band gap for accelerating the carriers, thereby maintaining high operating speeds and obtaining a stable high current amplification factor. Furthermore, the present invention aims to inhibit variations in EB breakdown voltage, while avoiding to make the manufacturing process more complicated.

A first semiconductor device according to the present invention includes a substrate having a first semiconductor layer; a second semiconductor layer provided on the first semiconductor layer, wherein the second semiconductor layer has a smaller band gap than the first semiconductor layer and is made of a mixed crystal semiconductor; and a third semiconductor layer, which is provided on the second semiconductor layer and has a larger band gap than the second semiconductor layer; wherein the semiconductor device functions as a heterojunction bipolar transistor in which at least a portion of the first semiconductor layer is a collector region including first conductive-type impurities; at least a portion of the second semiconductor layer is a base region including second conductive-type impurities; and at least a portion of the third semiconductor layer is an emitter region including the first conductive-type impurities; wherein the second semiconductor layer comprises a graded composition layer having a composition in which the band gap becomes larger in a direction from the collector region toward the emitter region, and a upper layer having a composition in which the band gap change ratio is smaller than the band gap change ratio of the graded composition layer; and an emitter-base junction is formed in the upper layer of the second semiconductor layer.

Thus, because the emitter-base junction is formed within the upper layer of the second semiconductor layer, which is made of a mixed crystal semiconductor, a high current amplification factor resulting from the narrow band gap can be achieved. Also, because the upper layer of the second semiconductor layer has a smaller band gap change ratio than the graded composition layer, even if there are fluctuations in the range to which the first conductive-type impurities are introduced for forming the emitter region, variations in the band gap of the emitter-base junction are reduced, and it is possible to inhibit the width of fluctuation in bipolar transistor properties, such as fluctuations of the current amplification factor.

It is preferable that the composition of the mixed crystal semiconductor in the upper layer of the second semiconductor layer is substantially constant, and the band gap in the upper layer is substantially constant. Thus, even if there are fluctuations in the range to which the first conductive-type impurities are introduced for forming the emitter region, it is possible to better suppress fluctuations of the bipolar transistor properties.

It is preferable that the composition of the mixed crystal semiconductor in the upper layer of the second semiconductor layer is substantially continuously changing, and the band gap of the upper layer changes to become larger in the direction from the collector region toward the emitter region. Thus, it is possible to more effectively achieve carrier acceleration functions, which result from the internal electric field, across the entire base layer.

It is preferable that the second semiconductor layer has a band gap in the upper layer which increases in the direction from the collector region toward the emitter region, and further comprises a top layer, in which the band gap change ratio is larger than the band gap change ratio of the upper layer. Thus, lattice strain resulting from different lattice constants at the border region between the second semiconductor layer and the third semiconductor layer is reduced, so it is possible to suppress crystal defects caused by lattice strain in the second and third semiconductor layers.

It is preferable that the second semiconductor layer is a SiGe layer, the third semiconductor layer is a Si layer, and the Ge content in the upper layer of the second semiconductor layer is in a range of 2 to 8%. Thus, it is easy to achieve both a high current amplification factor resulting from the narrow band gap of the second semiconductor layer, which is made of a mixed crystal semiconductor, and increased base transit speeds due to the graded composition.

It is preferable that the second semiconductor layer is a SiGe layer, the third semiconductor layer is a Si layer, and the Ge content in the top layer of the second semiconductor layer changes not more than 4%. Thus, crystal defects can be prevented, and a high current amplification factor resulting from the narrow band gap of the second semiconductor layer, which is made of a mixed crystal semiconductor, can be achieved easily.

It is also possible that the second semiconductor layer is a mixed crystal semiconductor layer including the three elements of silicon, germanium, and carbon, for example, and that the third semiconductor layer is a Si layer.

It is preferable that the emitter-base junction is positioned substantially in the center of the upper layer of the second semiconductor layer.

It is preferable that the impurity concentration in the graded composition layer of the second semiconductor layer decreases as the band gap increases in the direction from the collector region toward to the emitter region, and the impurity concentration in the upper layer of the second semiconductor layer is substantially constant. Thus, variations in EB breakdown voltage can be inhibited.

It is preferable that the second semiconductor layer is a SiGe layer, and the impurities in the second semiconductor layer are boron (B). Thus, the effects of the present invention can be attained effectively.

BRIEF DESCRIPTION OF THE DRAWINGS

FIG. 5 is a diagram showing the impurity concentration distribution and the change in the Ge content, in the depth direction of the cross section taken along the line Ia—Ia (see FIG. 1) of the SiGe-HBT according to the modified example of the third embodiment of the present invention.

FIG. 6 is a diagram showing the impurity concentration distribution and the change in the Ge content, in the depth direction of the cross section taken along the line Ia—Ia (see FIG. 1) of the SiGe-HBT according to the fourth embodiment of the present invention.

FIG. 7 is a diagram showing the impurity concentration distribution and the change in the Ge content, in the depth direction of the cross section taken along the line Ia—Ia (see FIG. 1) of the SiGe-HBT according to the modified example of the fourth embodiment of the present invention.

FIG. 12 is a diagram showing the impurity concentration distribution and change in the Ge content in the depth direction in a conventional SiGe-HBT when the flow rate of $B_2H_6$ is constant.

DETAILED DESCRIPTION OF THE INVENTION

First Embodiment

Figure 1:
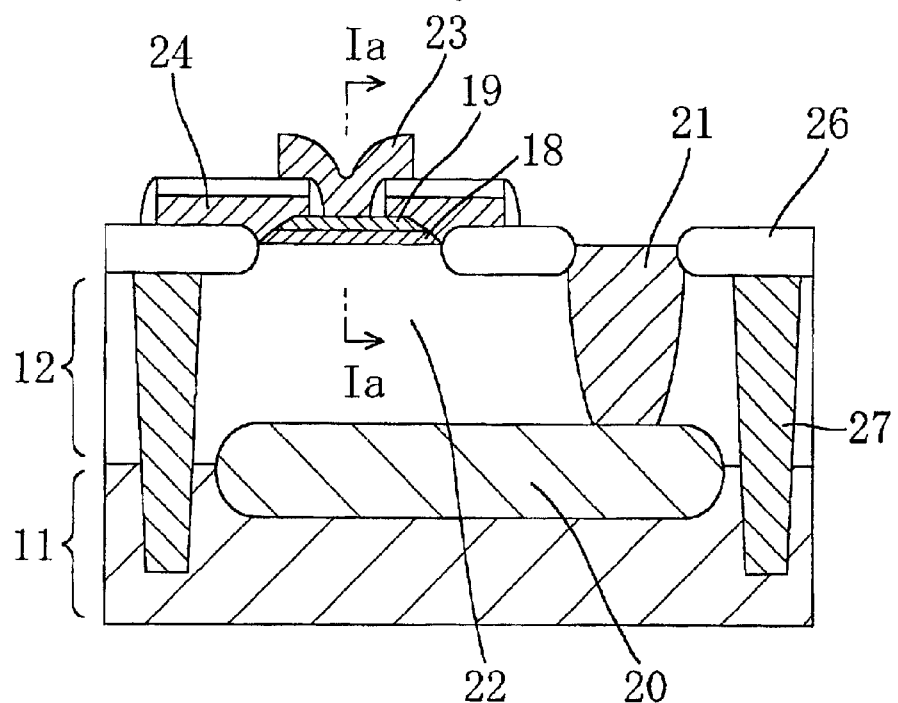
FIG. 1 is a cross-sectional view of a SiGe-HBT according to the first embodiment of the present invention.

FIG. 1 is a cross-sectional view of a SiGe-HBT according to a first embodiment of the present invention. As shown in FIG. 1, the SiGe-HBT of the present embodiment is formed using a Si substrate 11 and a Si epitaxial layer 12 epitaxially grown on the Si substrate 11. It includes an N⁺ buried layer 20 provided spanning a portion of the Si substrate 11 and a portion of the Si epitaxial layer 12, and an N⁺ collector lead layer 21, which is provided by introducing a relatively high concentration of N-type impurities into a portion of the Si epitaxial layer 12. The portion of the Si epitaxial layer 12 apart from the N⁺ collector lead layer 21 is an N⁻ collector diffusion layer 22, which includes N-type impurities at a low concentration. Furthermore, LOCOS isolations 26 separating the Si epitaxial layer 12 into the bipolar transistor formation regions, and deep trench isolations 27, which extend downward from the LOCOS isolations 26 and into the Si substrate 11, are also provided. However, in the bipolar transistor formation region there is no deep trench isolation 27 provided below the LOCOS isolation 26 separating the $N^+$ collector lead layer 21 and the $N^-$ collector diffusion layer 22.

Furthermore, a SiGe film 18, which is made of a SiGe mixed crystal semiconductor layer including P-type impurities, and a Si film 19, serving as a cap layer, are formed by epitaxial growth on the $N^-$ collector diffusion layer 22 of the Si epitaxial layer 12. The SiGe-HBT also includes a $P^+$ base polysilicon film 24, which is formed on the region spanning from the lateral surfaces of the SiGe film 18 and the Si film 19 to the upper surface of the Si film 19 and includes P-type impurities at a high concentration, and an $N^+$ emitter polysilicon film 23 including a high concentration of N-type impurities, which is provided over an opening formed in the $P^+$ base polysilicon film 24. However, the $P^+$ base polysilicon film 24 and the $N^+$ emitter polysilicon film 23 are electrically separated from one another by an insulating film.

Here, the SiGe film 18 and the Si film 19 are epitaxially grown using MBE, UHV-CVD, or LP-CVP. The region of the Si film 19 directly below the $N^+$ emitter polysilicon film 23 is doped with N-type impurities (phosphorus or arsenic, for example) that have been diffused by RTA from the $N^+$ emitter polysilicon film 23. That is, the $N^+$ region of the Si film 19 functions primarily as the emitter region of the NPN bipolar transistor, the $P^+$ region of the SiGe film 18 functions primarily as the base region of the NPN bipolar transistor, and the $N^-$ collector diffusion layer 22, the $N^+$ buried layer 20, and the $N^+$ collector lead layer 21 function as the collector region of the NPN bipolar transistor.

In the process for manufacturing the semiconductor device, after the SiGe film 18 is epitaxially grown on the Si epitaxial layer 12, the Si film 19 is then successively grown epitaxially on the SiGe film 18. The Si film 19 is necessary for preventing Ge contamination of the manufacturing line primarily during the further process steps after the epitaxial growth of SiGe, however, it is possible to form an emitter-base junction (hereinafter, called "EB junction") at a desired depth and position in the Si film 19 by adequately selecting the thermal processing conditions for diffusing the N-type impurities in accordance with the film thickness of the Si film 19 and the concentration of the N-type impurities in the emitter polysilicon film 23.

Figure 2:
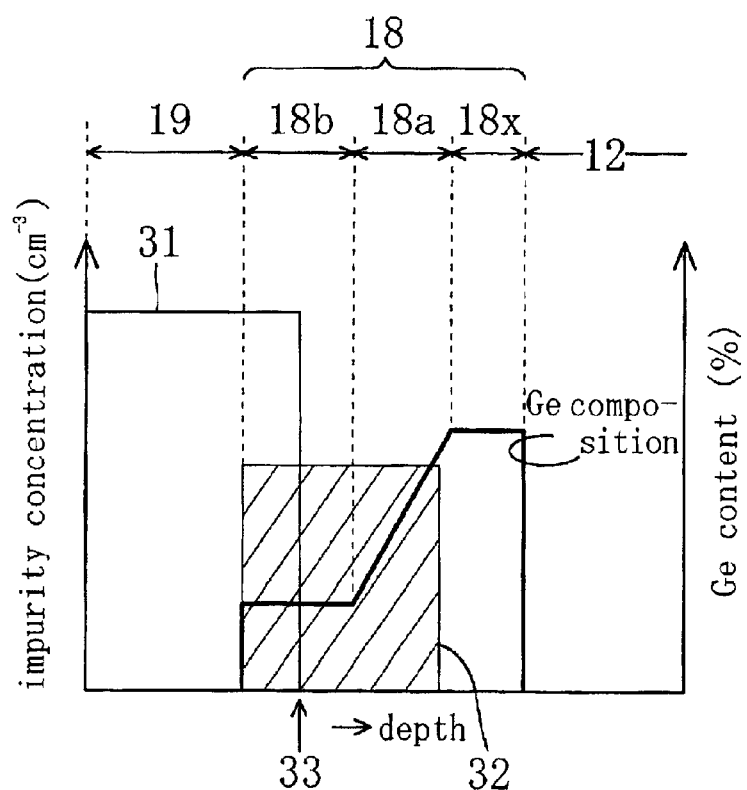
FIG. 2 is a diagram showing the impurity concentration distribution and the change in the Ge content, in the depth direction of the cross section taken along the line Ia—Ia (see FIG. 1) of the SiGe-HBT according to the first embodiment of the present invention.

FIG. 2 is a diagram showing the impurity concentration distribution and the change in the Ge content, in the depth direction of the cross section taken along the line Ia—Ia (see FIG. 1) of the SiGe-HBT according to the first embodiment of the present invention. As shown in FIG. 2, in the present embodiment, the SiGe film 18 is made of a SiGe buffer layer 18x, which is an undoped layer, a SiGe graded composition layer 18a, in which the Ge content changes continually and monotonically, and a SiGe upper layer 18b, in which the Ge content is substantially constant. This feature is characteristic of the present embodiment. This means that in the SiGe graded composition layer 18a, the Ge content is at a minimum value (2 to 8%, for example), increases from the emitter region toward the collector region, and when it reaches the SiGe buffer layer 18x, the Ge content is at a maximum value (20 to 30%, for example). That is, in the SiGe graded composition layer 18a, the band gap decreases in the direction from the emitter region toward the collector region, thereby accelerating carriers. In the SiGe upper layer 18b, the Ge content is substantially constant.

On the other hand, a P-type impurity diffusion region 32, serving as the base, is formed spanning the SiGe graded composition layer 18a and the SiGe upper layer 18b. An N-type impurity diffusion region 31 is formed spanning from the Si film 19 into a portion of the SiGe upper layer 18b. In other words, the SiGe-HBT is configured such that an EB junction 33, which is the border portion between the P-type impurity diffusion region 32 and the N-type impurity diffusion region 31, is within a portion of the SiGe upper layer 18b. That is, during thermal processing to form the emitter region, N-type impurities from the emitter polysilicon film 23 reach not only the Si film 19 but also the SiGe film 18 below the Si film 19. Even though the position of the EB junction 33 may fluctuate due to fluctuations and variations in the manufacturing process conditions, the thicknesses of the SiGe graded composition layer 18a, the SiGe upper layer 18b, and the Si film 19 are each set such that the EB junction 33 is within a portion of the SiGe upper layer 18b.

That is to say, the diffusion depth of the N-type impurities from the $N^+$ emitter polysilicon film 23 fluctuates between manufactured lots, between wafers, and within the wafer surface due to fluctuations and variations in the conditions of the manufacturing process, however, that range of fluctuation is known by experience from the process conditions, so if the thickness of the SiGe upper layer 18b is made larger than the width of fluctuation in diffusion depth of the N-type impurities, then it is possible to set the process conditions such that the EB junction 33 is almost certainly formed within the SiGe upper layer 18b.

It is particularly preferable that the central position in the thickness direction of the SiGe upper layer 18b and the center of the range of fluctuation in the depth to which the N-type impurities are diffused from the emitter polysilicon film 23 are set such that they are substantially matching. Usually, the upper limit of the Ge content in SiGe films is near 30%, so to attain both a high current amplification factor due to the narrow band gap of SiGe, and increased base transit speeds due to the graded composition, it is preferable that the Ge content in the SiGe upper layer 18b is in the range of 2 to 8%.

According to the present embodiment, even if there are fluctuations in the position of the EB junction 33 due to fluctuations and variations in the manufacturing process conditions, the manufacturing process is configured such that the EB junction 33 is formed in the SiGe upper layer 18b, which has a substantially constant Ge content, so that the Ge content in the EB junction 33 is kept substantially constant. Consequently, in the SiGe-HBT of the present embodiment, the EB junction 33 is in the SiGe upper layer 18b, so a high current amplification factor $h_{FE}$ due to the narrow band gap is maintained, while a relatively stable current amplification factor can be achieved.

It should be noted that the distribution of the Ge content can be easily set to a certain pattern by controlling the partial pressure ratio of the Ge and Si source gases ($GeH_4$ and $SiH_4$, for example) when epitaxially growing the SiGe layer.

Effects similar to those of the present embodiment can also be achieved by providing a SiGe film having a constant, small amount of Ge, in place of the Si film 19 formed on the SiGe film 18.

Second Embodiment

In the above-described first embodiment, the minority carriers (electrons) injected from the emitter region into the base region move only by diffusion while travelling through the SiGe upper layer 18b until reaching the region of the base region in which the Ge content changes (the SiGe graded composition layer 18a). Thus, during that time the effect of acceleration due to the internal electric field cannot be obtained, which from the viewpoint of high-speed operation is a slight drawback.

The SiGe-HBT according to the second embodiment of the present invention has been provided with a means for remedying this drawback of the first embodiment. That is, the present embodiment relates to a structure for inhibiting variations in the current amplification factor caused by fluctuations in location of an EB junction 33, while maintaining the minority carrier accelerating function, which results from the internal electric field, over the entire base region.

Figure 3:
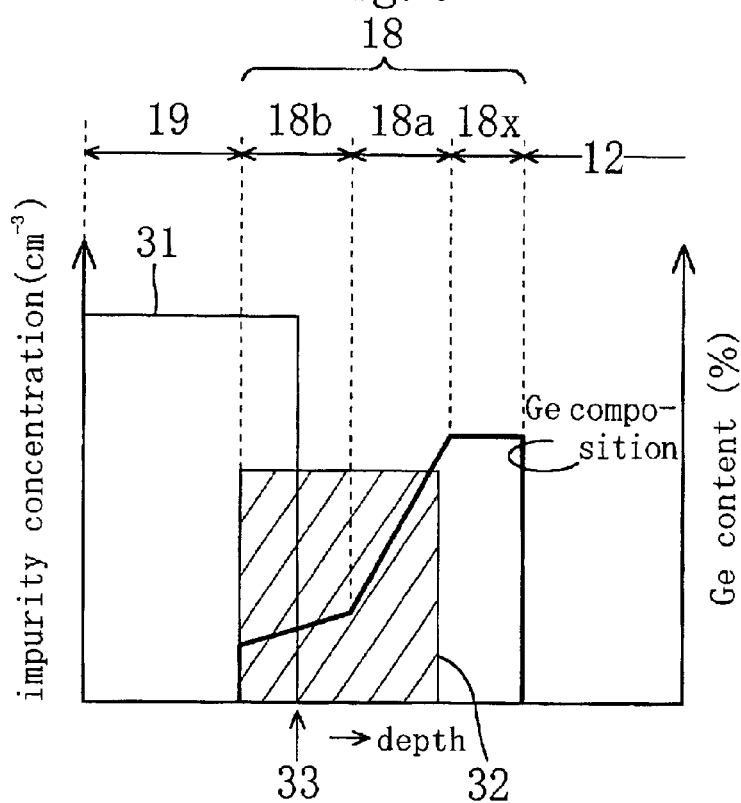
FIG. 3 is a diagram showing the impurity concentration distribution and the change in the Ge content, in the depth direction of the cross section taken along the line Ia—Ia (see FIG. 1) of the SiGe-HBT according to the second embodiment of the present invention.

FIG. 3 is a diagram showing the impurity concentration distribution and the change in the Ge content, in the depth direction of the cross section taken along the line Ia—Ia (see FIG. 1) of the SiGe-HBT according to the second embodiment of the present invention. The basic structure of the SiGe-HBT according to the present embodiment is as in the first embodiment shown in FIG. 1.

As illustrated in FIG. 3, in the SiGe-HBT according to the present embodiment, the Ge content in the SiGe upper layer 18b is not constant, but increases slowly from the emitter region toward the collector region. That is, the band gap in the SiGe upper layer 18b gently decreases from the emitter region toward the collector region, thus increasing the carrier acceleration function. Also, like in the first embodiment, the EB junction 33 is formed within the SiGe upper layer 18b, and the Ge content in the SiGe graded composition layer 18a significantly changes from the collector region toward the emitter region.

Also in the present embodiment, the thicknesses of the SiGe graded composition layer 18a, the SiGe upper layer 18b, and the Si film 19 are set so that even if the position of the EB junction 33 fluctuates due to fluctuations and variations in the manufacturing process conditions, the EB junction 33 is positioned within the SiGe upper layer 18b.

Also, the diffusion depth of N-type impurities from the $N^+$ emitter polysilicon film 23 fluctuates between manufactured lots, between wafers, and within the wafer surface due to fluctuations and variations in the conditions of the manufacturing process, however, that range of fluctuation is known by experience from the processing conditions, so if the thickness of the SiGe upper layer 18b is made larger than the width of fluctuation in the diffusion depth of the N-type impurities, then the process conditions can be set such that the EB junction 33 is almost certainly formed within the SiGe upper layer 18b.

It is particularly preferable that the central position of the SiGe upper layer 18b in the thickness direction and the center of the range of fluctuation in the depth at which the N-type impurities are diffused from the emitter polysilicon film 23 are set such that they are substantially matching. Usually, the upper limit of the Ge content in SiGe films is near 30%, so to achieve both a high current amplification factor resulting from the narrow band gap of SiGe, and increased transit speeds in the base due to a graded composition, it is preferable that the Ge content in the SiGe upper layer 18b changes within the range of 2 to 8%, and the change in content is not larger than 4%.

As in the above-described first embodiment, in the present embodiment the EB junction 33 is formed in the SiGe upper layer 18b, and a high current amplification factor $h_{FE}$ due to the narrow band gap can be maintained. Also, even if there are fluctuations in the diffusion depth of the N-type impurities from the emitter polysilicon film 23, the change of the Ge content in the SiGe upper layer 18b is relatively small, so variations in the Ge content caused by fluctuations in the position of the EB junction 33 in the SiGe upper layer 18b can be inhibited. Furthermore, when minority carriers (electrons) are injected into the SiGe upper layer 18b, the minority carrier acceleration function resulting from the internal electric field can also be obtained when the electrons are moving through the SiGe upper layer 18b, which has a graded composition. Thus, the SiGe-HBT of the present embodiment can achieve a further increase in operating speed over that of the first embodiment.

It should be noted that the present embodiment includes the feature of a bend in the line of the change of the Ge content in the SiGe film 18 at the border portion between the SiGe graded composition layer 18a and the SiGe upper layer 18b. However, by continually changing the Ge content in the border portion between the SiGe graded composition layer 18a and the SiGe upper layer 18b, it is also possible to ensure that this feature of the bend in the line of the change of the Ge content does not occur. With such a structure, the carrier acceleration function due to the internal electric field can be more effectively achieved.

Third Embodiment

The SiGe-HBT of the third embodiment of the present invention, like the first and second embodiments, is provided with a means for inhibiting variations in the current amplification factor caused by fluctuations in the position of the EB junction, and furthermore for inhibiting crystal defects from occurring between the SiGe film and the Si film.

Figure 4:
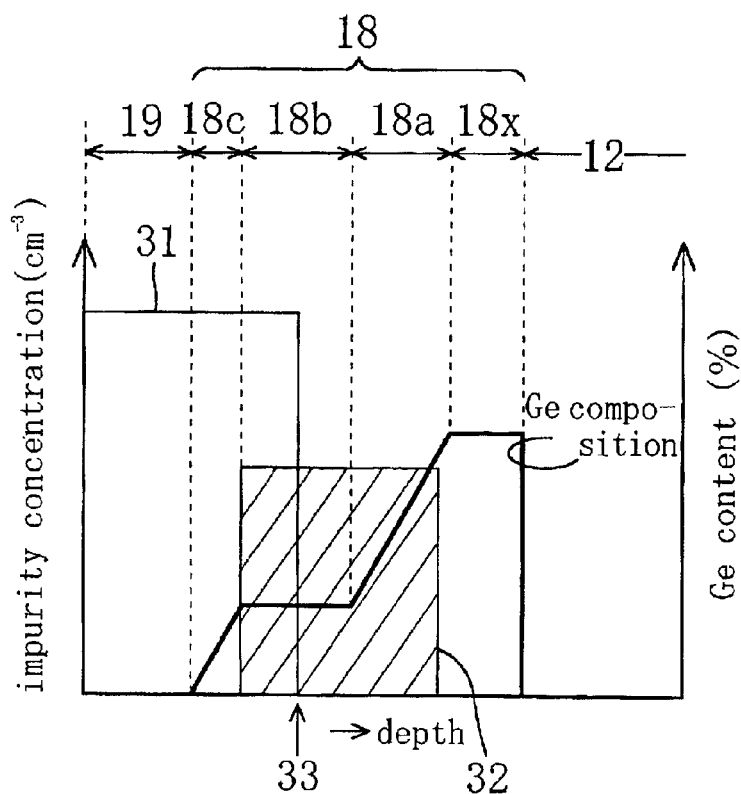
FIG. 4 is a diagram showing the impurity concentration distribution and the change in the Ge content, in the depth direction of the cross section taken along the line Ia—Ia (see FIG. 1) of the SiGe-HBT according to the third embodiment of the present invention.
Figure 8:
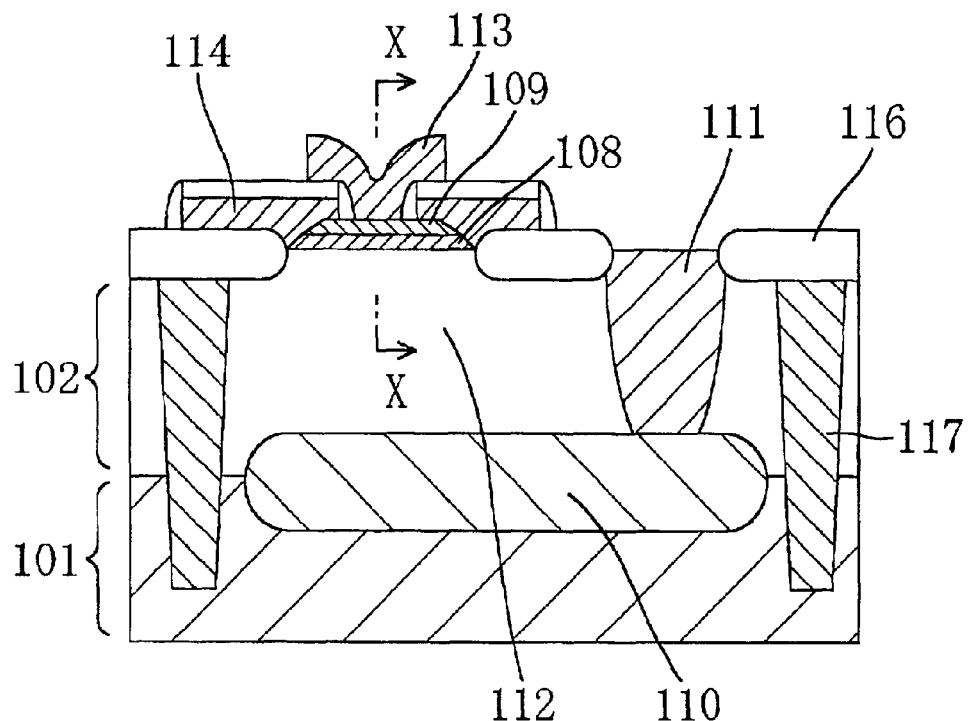
FIG. 8 is a cross-sectional view of a conventional SiGe-HBT.
Figure 9:
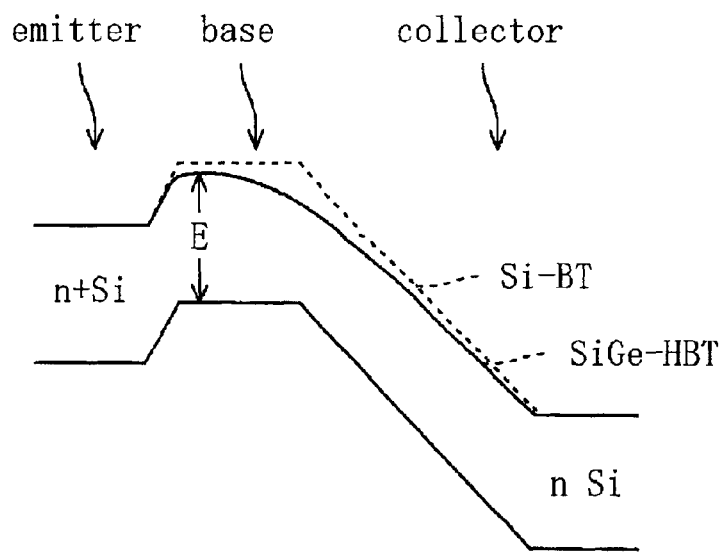
FIG. 9 is an energy band diagram for comparing the band structures of a SiGe-HBT with a graded composition and a Si-BT.
Figure 10:
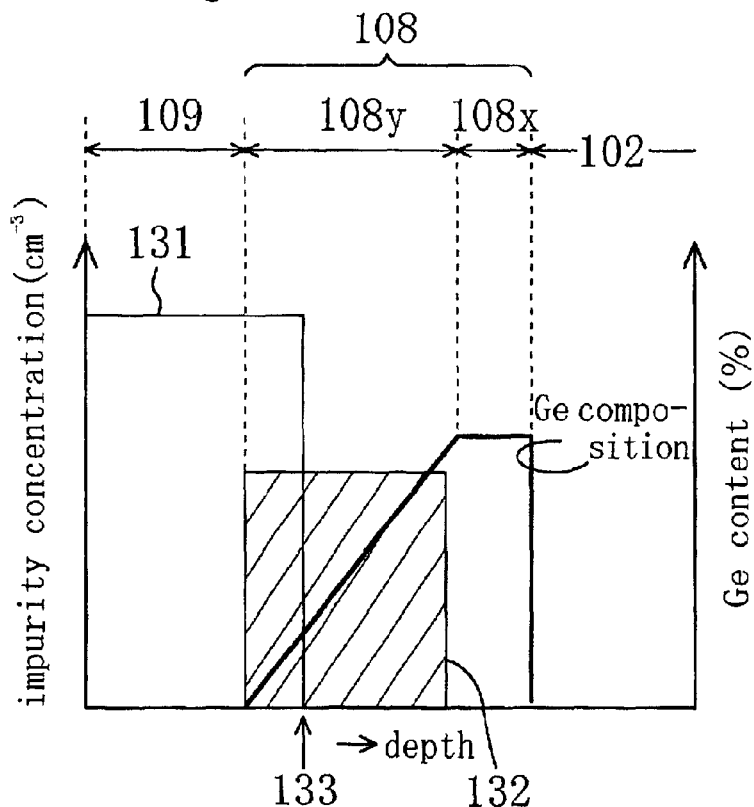
FIG. 10 is a diagram showing the impurity concentration distribution and the change in the Ge content in the depth direction in the cross section taken along the line X—X shown in FIG. 8.
Figure 11:
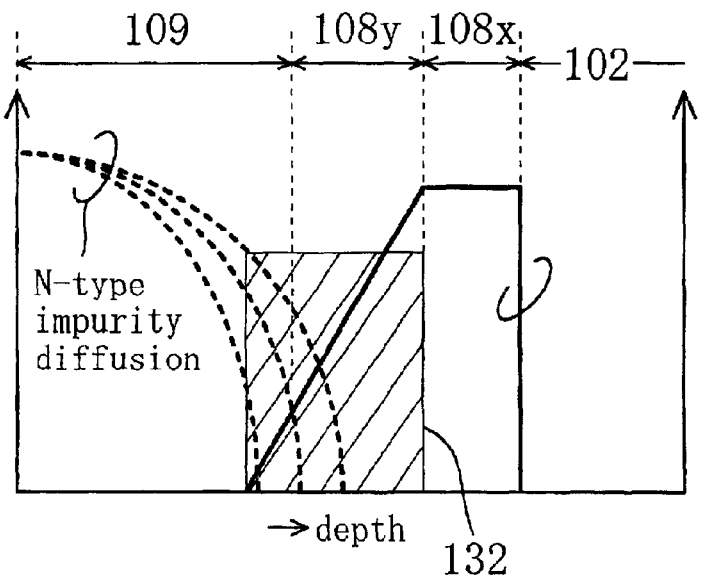
FIG. 11 is a diagram for describing the variations in the diffusion depth of N-type impurities in the SiGe graded composition layer.

FIG. 4 is a diagram showing the impurity concentration distribution and the change in the Ge content in the depth direction of the cross section taken along the line Ia—Ia (see FIG. 1) of the SiGe-HBT according to the third embodiment of the present invention. The basic structure of the SiGe-HBT of the present embodiment is as in the first embodiment shown in FIG. 1.

In the SiGe-HBT according to the present embodiment, the SiGe film 18 has a SiGe top layer 18c, in addition to the SiGe graded composition layer 18a and the SiGe upper layer 18b. The Ge content in the SiGe upper layer 18b is substantially constant, and the Ge content in the SiGe top layer 18c decreases sharply from the collector region toward the emitter region and is substantially zero at the portion adjacent to the Si film 19. That is, the Ge content in the SiGe top layer 18c decreases sharply in the direction from the collector region toward the emitter region, and the upper edge of the SiGe top layer 18c has the same band gap as Si. The EB junction 33 is formed in the SiGe upper layer 18b. Also, P-type impurities (boron) are introduced into the SiGe graded composition layer 18a and the SiGe upper layer 18b, but are hardly introduced at all into the SiGe top layer 18c. As in the first and second embodiments, the Ge content in the SiGe graded composition layer 18a increases in the direction from the emitter region toward the collector region.

In the present embodiment, the thicknesses of the SiGe graded composition layer 18a, the SiGe upper layer 18b, the SiGe top layer 18c, and the Si film 19 are set so that even if the position of the EB junction 33 fluctuates due to fluctuations or variations in the manufacturing process conditions, the EB junction 33 is positioned within the SiGe upper layer 18b.

Also, the diffusion depth of N-type impurities from the $N^+$ emitter polysilicon film 23 fluctuates between manufactured lots, between wafers, and within the wafer surface due to fluctuations or variations in the conditions of the manufacturing process, however, that range of fluctuation is known by experience from the processing conditions, so if the thickness of the SiGe upper layer 18b is larger than the width of fluctuation in the diffusion depth of the N-type impurities, then it becomes possible to set the process conditions such that the EB junction 33 is almost certainly formed within the SiGe upper layer 18b.

Also in the present embodiment, it is preferable that the central position of the SiGe upper layer 18b in the thickness direction and the center of the range of fluctuation in the depth to which the N-type impurities are diffused from the emitter polysilicon film 23, are set such that they are substantially matching. Usually, the upper limit of the Ge content in SiGe films is near 30%, so to attain both a high current amplification factor resulting from a narrow band gap of SiGe, and increased transit speeds in the base due to a graded composition, it is preferable that the Ge content in the SiGe upper layer 18b changes within the range of 2 to 8%.

In the present embodiment, as in the first embodiment, the Ge content at the EB junction 33 is substantially constant, so the same effects as those of the first embodiment can be obtained. Additionally, the Ge content in the SiGe top layer 18c becomes continually smaller in an upward direction, and is zero at the portion adjacent to the Si film 19. Thus, the following effects can be attained.

In the case of the first and second embodiments, the upper end portion of the SiGe film 18 (the SiGe upper layer 18b) has Ge content has a constant value that is not zero. The lattice constants of Si and Ge, however, differ by of about 4%, so lattice mismatching occurs between the SiGe upper layer 18b and the Si film 19. This results in the risk that crystal defects due to lattice strain may occur in the Si film 19 and the SiGe film 18.

In contrast, in the present embodiment there is hardly any lattice mismatching between the upper end portion of the SiGe film 18 (the SiGe top layer 18c) and the Si film 19. Consequently, it is possible to effectively inhibit crystal defects due to lattice strain from occurring in the SiGe film 18 and the Si film 19.

MODIFIED EXAMPLE

FIG. 5 is a diagram showing the impurity concentration distribution and the change in the Ge content, in the depth direction of the cross section taken along the line Ia—Ia (see FIG. 1) of the SiGe-HBT according to a modified example of the third embodiment of the present invention. The basic structure of the SiGe-HBT of this modified example is as in the first embodiment shown in FIG. 1.

This modified example is configured such that the Ge content in the SiGe upper layer 18b is not constant but increases gently in the direction from the emitter region toward the collector region, so as to increase the carrier acceleration function due to the reduction in the band gap. Furthermore, as in the third embodiment, the EB junction 33 is formed within the SiGe upper layer 18b, and the Ge content in the SiGe top layer 18c decreases sharply in the direction from the collector region toward the emitter region and is substantially zero at the portion adjacent to the Si film 19.

In this modified example, in addition to the same effects as those of the above-described third embodiment, as in the second embodiment it is possible to improve the function of accelerating the minority carriers (electrons) injected from the emitter region into the base region due to the internal electric field in the SiGe upper layer 18b.

Usually, in order to attain both a high current amplification factor resulting from a narrow band gap of SiGe, and increased transit speeds in the base due to a graded composition, while preventing crystal defects, it is preferable that the Ge content in the SiGe upper layer 18b is in the range of 2 to 8% and changes not more than 4%.

The Ge content in the portion of the SiGe top layer 18c that is adjacent to the Si film 19 in the third embodiment or the modified example thereof does not have to be zero, and the effect of inhibiting crystal defects due to lattice strain can be achieved as long as the value is near zero. However, to more effectively achieve the effects of the present embodiment it is preferable that the Ge content in the portion of the SiGe top layer 18c that is adjacent to the Si film 19 is zero.

Fourth Embodiment

Like the first through third embodiments, the SiGe-HBT of the fourth embodiment of the present invention inhibits variations in the current amplification factor caused by fluctuations in the position of the EB junction, and is further provided with a means for inhibiting variations in EB breakdown voltage.

FIG. 6 is a diagram showing the impurity concentration distribution and the change in the Ge content, in the depth direction of the cross section taken along the line Ia—Ia (see FIG. 1) of the SiGe-HBT according to the fourth embodiment of the present invention. The basic structure of the SiGe-HBT of the present embodiment is as in the first embodiment shown in FIG. 1.

As shown in FIG. 6, in the present embodiment, the SiGe film 18 is made up by the SiGe buffer layer 18x, which is an undoped layer, the SiGe graded composition layer 18a, in which the Ge content changes continually and monotonically, and the SiGe upper layer 18b, in which the Ge content is substantially constant. In the SiGe graded composition layer 18a, the Ge content has a minimum value (a value of 2 to 8%, for example) that continually increases in the direction from the emitter region toward the collector region, and when it has reached the SiGe buffer layer 18x, the Ge content has a maximum value (a value of 20 to 30%, for example). The Ge content has a substantially constant value in the SiGe upper layer 18b.

The P-type impurity diffusion region 32, serving as the base, is formed spanning the SiGe graded composition layer 18a and the SiGe upper layer 18b. Additionally, the N-type impurity diffusion region 31 is formed spanning from the Si film 19 into a portion of the SiGe upper layer 18b. That is, the EB junction 33, which is the border between the P-type impurity diffusion region 32 and the N-type impurity diffusion region 31, is formed so as to be at a position within the SiGe upper layer 18b. In other words, during thermal processing for forming the emitter region, N-type impurities from the emitter polysilicon film 23 reach not only the Si film 19 but also the SiGe film 18 below the Si film 19. The thicknesses of the SiGe graded composition layer 18a, the SiGe upper layer 18b, and the Si film 19 are set so that even if the position of the EB junction 33 fluctuates due to fluctuations or variations in the manufacturing process conditions, the EB junction 33 is positioned within the SiGe upper layer 18b.

That is, the diffusion depth of N-type impurities from the N$^+$ emitter polysilicon film 23 fluctuates between manufactured lots, between wafers, and within the wafer surface due to fluctuations and variations in the conditions of the manufacturing process, however, that range of fluctuation is known by experience from the processing conditions, so if the thickness of the SiGe upper layer 18b is made larger than the width of fluctuation in the diffusion depth of the N-type impurities, then the process conditions can be set such that the EB junction 33 is almost certainly formed within the SiGe upper layer 18b.

However, in the present embodiment, the concentration of boron in the SiGe graded composition layer 18a of the SiGe film 18 decreases together with the significant decrease toward the emitter side in the Ge content of the SiGe graded composition layer 18a. The Ge content in the SiGe upper layer 18b is substantially constant, however, so the concentration of boron in the SiGe upper layer 18b is kept substantially constant.

Also in the present embodiment, it is preferable that the process is set so that the central position of the SiGe upper layer 18b in its thickness direction and the center of the fluctuation range of the depth at which the N-type impurities are diffused from the emitter polysilicon film 23, are substantially matching.

In the present embodiment, as in the first embodiment, the Ge content in the EB junction 33 is substantially constant. Thus, like in the first embodiment, even if variations in the depth of N-type impurity diffusion are taken into consideration, it is easy to adjust the film thickness of the layers such that the EB junction 33 is positioned in the SiGe upper layer 18b, which has a substantially constant Ge content. Additionally, the boron concentration in the SiGe upper layer 18b is kept substantially constant, so even if there are fluctuations or variations in the manufacturing processing conditions, it is possible to keep a substantially constant boron concentration and Ge content in the EB junction 33. Thus, variations in EB breakdown voltage can be inhibited.

On the other hand, increasing the flow rate of $B_2H_6$ to compensate for the amount of boron incorporated along with the drop in Ge content (drop in $GeH_4$ flow rate) makes it principally possible to maintain a constant boron concentration in the SiGe film, however, this method makes the manufacturing process more complex.

In contrast, in the case of the present embodiment, it is sufficient if the flow rate of the boron source gas ($B_2H_6$) is kept substantially constant during the formation of the SiGe film, and thus variations in EB breakdown voltage can be reliably inhibited by a simple process.

MODIFIED EXAMPLE

FIG. 7 is a diagram showing the impurity concentration distribution and the change in the Ge content, in the depth direction of the cross section taken along the line Ia—Ia (see FIG. 1) of the SiGe-HBT according to a modified example of the fourth embodiment of the present invention. The basic structure of the SiGe-HBT of this modified example is as in the first embodiment shown in FIG. 1.

In this modified example, the SiGe-HBT is configured such that the Ge content in the SiGe upper layer 18b is not constant but rather gently increasing in the direction from the emitter region toward the collector region, so that there is a greater carrier acceleration function due to the reduction in the band gap. Also, like in the fourth embodiment, the EB junction 33 is formed in the SiGe upper layer 18b.

In addition to having the same effects as the above-described fourth embodiment, with this modified example, as with the second embodiment, it is possible to increase the function of accelerating the minority carriers (electrons) injected from the emitter region into the base region due to the internal electric field in the SiGe upper layer 18b.

On the other hand, in the SiGe upper layer 18b, the boron concentration changes along with the change of the Ge content, however, because the change of the Ge content in the SiGe graded composition layer 18a is smaller than the change of the Ge content in the SiGe graded layer 18a, the change in boron concentration in the SiGe upper layer 18b is small. Thus, with this modified example it is possible to inhibit variations in EB breakdown voltage.

It should be noted that it is also possible to provide the fourth embodiment or modified example thereof with a SiGe top layer 18c having a graded composition of Ge, such as that of the third embodiment.

Other Embodiments

The first through fourth embodiments described examples in which the present invention was applied to a bipolar transistor having a Si/SiGe heterojunction (SiGe-HBT), however the same effects as in the first through fourth embodiments can also be achieved when applying the present invention to a bipolar transistor having a Si/SiGeC or SiGe/SiGeC heterojunction to achieve. In this case, the base layer becomes a three-element mixed crystal semiconductor layer including silicon, germanium, and carbon (C).

Furthermore, the present invention is applicable not only to a HBT having a mixed crystal semiconductor layer as in the first through fourth embodiments, but the same effects as in the first through fourth embodiments can also be achieved when applying the present invention to a HBT having a compound semiconductor layer including indium (In), gallium (Ga), and phosphorous (P), for example.

The invention may be embodied in other specific forms without departing from the spirit or essential characteristics thereof. The embodiments disclosed in this application are to be considered in all respects as illustrative and not restrictive, the scope of the invention being indicated by the appended claims rather than by the foregoing description. All changes that come within the meaning and range of equivalency of the claims are intended to be embraced therein.

What is claimed is:

1. A semiconductor device, comprising:

a substrate having a first semiconductor layer;

a second semiconductor layer provided on the first semiconductor layer, wherein the second semiconductor layer has a smaller band gap than the first semiconductor layer and is made of a mixed crystal semiconductor; and a third semiconductor layer, which is provided on the second semiconductor layer and has a larger band gap than the second semiconductor layer;

wherein the semiconductor device functions as a heterojunction bipolar transistor in which at least a portion of the first semiconductor layer is a collector region including first conductive-type impurities; at least a portion of the second semiconductor layer is a base region including second conductive-type impurities; and at least a portion of the third semiconductor layer is an emitter region including the first conductive-type impurities;

wherein the second semiconductor layer comprises a graded composition layer having a composition in which the band gap becomes larger in a direction from the collector region toward the emitter region, and a upper layer having a composition in which the band gap change ratio is smaller than the band gap change ratio of the graded composition layer;

a band gap in the upper layer of the second semiconductor layer decreases gradually in a direction from the emitter region toward the collector region, and the impurity concentration in the upper layer is substantially constant, and an emitter-base junction is formed in the upper layer of the second semiconductor layer.

2. The semiconductor device according to claim 1, wherein the second semiconductor layer has a band gap in its upper layer which increases in the direction from the collector region toward the emitter region, and further comprises a top layer, in which the band gap change ratio is larger than the band gap change ratio of the upper layer.

3. The semiconductor device according to claim 1, wherein the second semiconductor layer is a SiGe layer;

the third semiconductor layer is a Si layer; and the Ge content in the upper layer of the second semiconductor layer changes not more than 4%.

4. The semiconductor device according to claim 1, wherein the second semiconductor layer is a SiGe layer;

the third semiconductor layer is a Si layer; and the Ge content in the upper layer of the second semiconductor layer is in a range of 2 to 8%.

5. The semiconductor device according to claim 1, wherein the second semiconductor layer is a three-element mixed crystal semiconductor layer including silicon, germanium, and carbon; and the third semiconductor layer is a Si layer.

6. The semiconductor device according to claim 1, wherein the emitter-base junction is positioned substantially in the center of the upper layer of the second semiconductor layer.

7. The semiconductor device according to claim 1, wherein the impurity concentration in the graded composition layer of the second semiconductor layer decreases as the band gap increases in the direction from the collector region toward to the emitter region.

8. The semiconductor device according to claim 7, wherein the second semiconductor layer is a SiGe layer, and the impurities in the second semiconductor layer are boron (B).

9. The semiconductor device according to claim 1, wherein the second semiconductor layer is a SiGe layer;

the Ge content in the upper layer of the second semiconductor layer is not constant, and gradually increases in the direction from the emitter region toward the collector region; and the Ge content in the graded composition layer of the second semiconductor layer increases in the direction from the collector region toward the emitter region.

* * * * *